United States Patent
Wang et al.

(10) Patent No.: US 11,757,048 B1
(45) Date of Patent: Sep. 12, 2023

(54) METHOD FOR PRODUCING GALLIUM OXIDE SCHOTTKY BARRIER DIODE WITH NEGATIVE BEVELED ANGLE TERMINAL

(71) Applicant: The 13th Research Institute of China Electronics Technology Group Corporation, Shijiazhuang (CN)

(72) Inventors: Yuangang Wang, Shijiazhuang (CN); Yuanjie Lv, Shijiazhuang (CN); Shaobo Dun, Shijiazhuang (CN); Tingting Han, Shijiazhuang (CN); Hongyu Liu, Shijiazhuang (CN); Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 18/139,922

(22) Filed: Apr. 26, 2023

Related U.S. Application Data

(63) Continuation of application No. PCT/CN2022/140335, filed on Dec. 20, 2022.

(30) Foreign Application Priority Data

May 31, 2022 (CN) .......................... 202210612243.5

(51) Int. Cl.
   *H01L 21/00* (2006.01)
   *H01L 29/00* (2006.01)
   *H01L 29/872* (2006.01)
   *H01L 29/24* (2006.01)
   *H01L 29/66* (2006.01)
   *H01L 21/027* (2006.01)
   *H01L 21/465* (2006.01)
   *H01L 29/06* (2006.01)

(52) U.S. Cl.
   CPC ........ *H01L 29/872* (2013.01); *H01L 21/0272* (2013.01); *H01L 21/465* (2013.01); *H01L 29/0661* (2013.01); *H01L 29/24* (2013.01); *H01L 29/66969* (2013.01)

(58) Field of Classification Search
   CPC ............... H01L 21/0272; H01L 21/465; H01L 21/02274; H01L 21/02414; H01L 29/872; H01L 29/0661; H01L 29/24; H01L 29/66969
   See application file for complete search history.

(56) References Cited

FOREIGN PATENT DOCUMENTS

| | | |
|---|---|---|
| CN | 101807647 A | 8/2010 |
| CN | 102496572 A | 6/2012 |
| CN | 111755531 A | 10/2020 |
| JP | 2001068689 A | 3/2001 |

*Primary Examiner* — Nikolay K Yushin
(74) *Attorney, Agent, or Firm* — AP3 Law Firm PLLC

(57) ABSTRACT

A gallium oxide Schottky barrier diode with negative beveled angle terminal and a production method thereof are provided. The production method includes four steps. In the first step, a photoresist layer with a preset pattern is formed on a gallium oxide epitaxial layer, where the gallium oxide epitaxial layer is formed on an upper surface of a gallium oxide substrate. In the second step, first electrode layer is formed on the gallium oxide epitaxial layer. In the third step, the gallium oxide substrate is rotated and the gallium oxide epitaxial layer is etched. In the fourth step, a second electrode layer is formed on the lower surface of the gallium oxide substrate.

7 Claims, 5 Drawing Sheets

METHOD FOR PRODUCING GALLIUM OXIDE SCHOTTKY BARRIER DIODE WITH NEGATIVE BEVELED ANGLE TERMINAL

CROSS-REFERENCE TO RELATED APPLICATIONS

This application is a continuation application of International Application No. PCT/CN2022/140335, filed on Dec. 20, 2022, which claims priority to Chinese Patent Application No. CN 202210612243.5, filed on May 31, 2022. The disclosures of the aforementioned applications are hereby incorporated herein by reference in their entireties.

TECHNICAL FIELD

The application belongs to the technical field of production of semiconductor device, and particularly relates to a method for producing gallium oxide Schottky barrier diode with negative beveled angle terminal.

BACKGROUND

Gallium oxide is an emerging semiconductor material, which has a series of excellent properties such as large band gap and high theoretical breakdown electric field. The use of gallium oxide to manufacture power semiconductor devices has gradually become an important development direction. In some specific areas, gallium oxide power devices are expected to replace traditional silicon-based power devices. Schottky barrier diode (SBD) is a power semiconductor device and SBD made with gallium oxide may be called gallium oxide SBD. Schottky diodes have the advantages of high switching frequency and small forward voltage drop. However, the reduction of Schottky barrier height due to image force limits the advantageous characteristics of gallium oxide SBD. To solve this problem, high-resistance terminals, field plate terminals, or beveled angle terminals can be used, all of which are beneficial to improve device characteristics.

Beveled angle terminal is a kind of terminal structure of SBD that may be formed by means of etching. Beveled angle terminal includes positive beveled angle terminal and negative beveled angle terminal. As shown in FIG. 6, the basic structure of an SBD typically includes a cathode 61, a substrate 62, an epitaxial layer 63 and an anode 64. FIG. 7 shows an SBD with positive beveled angle terminal, which may be produced on the basis of the SBD shown in FIG. 6. The epitaxial layer 631 of the SBD shown in FIG. 7 appends a positive beveled angle terminal 65. FIG. 8 shows an SBD with negative beveled angle terminal, which may be produced on the basis of the SBD shown in FIG. 6. The epitaxial layer 632 of the SBD shown in FIG. 8 appends a negative beveled angle terminal 66.

Compared with the positive beveled angle terminal, the negative beveled angle terminal has more advantages, its surface has stronger electric field control ability, and it saves more area. However, as shown in FIG. 8, a part of the negative beveled angle is hidden under the anode 64, and the material of the epitaxial layer 632 of this part is hard to be removed by the etching methods in the prior art. That is, it is hard for the etching methods in the prior art to realize the processing of the negative beveled angle of the negative beveled angle terminal 66.

SUMMARY

This and other problems are generally solved or circumvented, and technical advantages are generally achieved, by embodiments of the present application which provide a method for producing gallium oxide Schottky barrier diode with negative beveled angle terminal.

Technical Problems

The application provides a gallium oxide Schottky barrier diode with negative beveled angle terminal and a production method thereof and intends to solve the technical problem that negative beveled angle terminal is hard to be processed by the etching method in the prior art. The method can realize the processing of negative beveled angle terminal of gallium oxide Schottky barrier diode, so as to improve device characteristics effectively.

Technical Solutions

In order to achieve the above purpose, the technical solution adopted in the present application is as follows:

In the first aspect, the present application provides a method for producing gallium oxide Schottky barrier diode with negative beveled angle terminal. The method includes the following four steps.

The first step is forming a photoresist layer with a preset pattern on a gallium oxide epitaxial layer, where a first part of the gallium oxide epitaxial layer is not covered by the photoresist layer and the gallium oxide epitaxial layer is formed on an upper surface of a gallium oxide substrate.

The second step is forming a temporary electrode layer on the gallium oxide epitaxial layer and the photoresist layer, and removing the photoresist layer to form a first electrode layer.

The third step is taking a horizontal plane as a reference, rotating the gallium oxide substrate by a first tilt angle in a first direction and by a second tilt angle in a second direction, and etching a second part of the gallium oxide epitaxial layer and a third part of the gallium oxide epitaxial layer, respectively, both of which can be exposed and partially under the first electrode layer, where both the first tilt angle and the second tilt angle are less than 90 degrees. After the gallium oxide substrate is rotated in the first direction, the first tilt angle is formed between the gallium oxide substrate and the horizontal plane, and the second part of the gallium oxide epitaxial layer is exposed. Similarly, after the gallium oxide substrate is rotated in the second direction, the second tilt angle is formed between the gallium oxide substrate and the horizontal plane, and the third part of the gallium oxide epitaxial layer is exposed. The third part is a part of the gallium oxide epitaxial layer that has been etched after the gallium oxide substrate is rotated in the first direction.

The fourth step is forming a second electrode layer on the lower surface of the gallium oxide substrate.

In a possible implement of the first aspect, forming the photoresist layer with the preset pattern includes: forming a temporary photoresist layer on the gallium oxide epitaxial layer; and photoetching the temporary photoresist layer to form the preset pattern and expose the first part of the gallium oxide epitaxial layer, and the photoresist layer with the preset pattern is formed.

In a possible implement of the first aspect, forming the temporary electrode layer on the gallium oxide epitaxial layer and the photoresist layer, and removing the photoresist layer to form the first electrode layer include the following two steps.

The first step is forming a first part of the temporary electrode layer on the photoresist layer and a second part of the temporary electrode layer on the first part of the gallium oxide epitaxial layer; and The second step is removing the photoresist layer and the first part of the temporary electrode layer, where the second part of the temporary electrode layer is retained as a first electrode layer.

In a possible implement of the first aspect, both the first tilt angle and the second tilt angle are more than 30 degrees and less than 60 degrees.

In a possible implement of the first aspect, the first tilt angle is equal to the second tilt angle.

In a possible implement of the first aspect, both etching the second part of the gallium oxide epitaxial layer and etching the third part of the gallium oxide epitaxial layer are performed in a plurality of times to ensure the etching accuracy.

In a possible implement of the first aspect, the temporary electrode layer is formed by electron beam evaporation or sputtering metal and the second electrode layer is formed by electron beam evaporation.

In a possible implement of the first aspect, the gallium oxide substrate is a high doped N type gallium oxide substrate and the gallium oxide epitaxial layer is a low doped N type gallium oxide epitaxial layer.

In the second aspect, the present application provides a gallium oxide diode device includes the following four parts.

The first part is a gallium oxide substrate.

The second part is a gallium oxide epitaxial layer formed on the gallium oxide substrate, where an upper part of the gallium oxide epitaxial layer is a boss structure, where the boss structure extends from the gallium oxide epitaxial layer to the gallium oxide substrate with a width of the boss structure decreasing gradually.

The third part is a first electrode layer formed on the gallium oxide epitaxial layer.

The fourth part is a second electrode layer formed on a lower surface of the gallium oxide substrate.

In a possible implement of the second aspect, the gallium oxide diode device is produced by the method provided in any possible implement of the first aspect.

It should be understood that the above general description and the following detailed description are only exemplary and explanatory and do not limit the present application.

Advantageous Effects of the Disclosure

Compared with the prior art, the advantageous effects of the method for producing gallium oxide Schottky barrier diode with negative beveled angle terminal provided by the present application are as follows:

when the production method provided in the present application is implemented, by rotating the gallium oxide substrate in two reverse directions, respectively, at a certain angle, it can partially expose the gallium oxide epitaxial layer under the first electrode layer to the etching range, thus realizing the processing of the negative beveled angle terminal and solving the technical problem that the negative beveled angle terminal is hard to be processed by the etching method in the prior art. Every above non-vertical rotation corresponds to at least one etches. The next etch continuously complements the previous etch, and finally forms the negative beveled angle terminal. In addition, self-alignment technique may be used in the production process of the Schottky barrier diode, such as anode self-aligning filling. A gallium oxide diode device with the negative beveled angle terminal has good withstand voltage characteristic.

It should be understood that the advantageous effects of gallium oxide diode device provided in the second aspect are same to those of the method provided in the first aspect and are not repeated here.

BRIEF DESCRIPTION OF THE DRAWINGS

In order to more clearly illustrate the technical solutions in the embodiments of this application, the accompanying drawings to be used in the descriptions of the embodiments or the prior art will be briefly described below. Obviously, the accompanying drawings in the following description are only some embodiments of this application, and for a person of ordinary skill in the art, without involving any inventive effort, other accompanying drawings may also be obtained according to these accompanying drawings.

DETAILED DESCRIPTION OF ILLUSTRATIVE EMBODIMENTS

Figure 1:
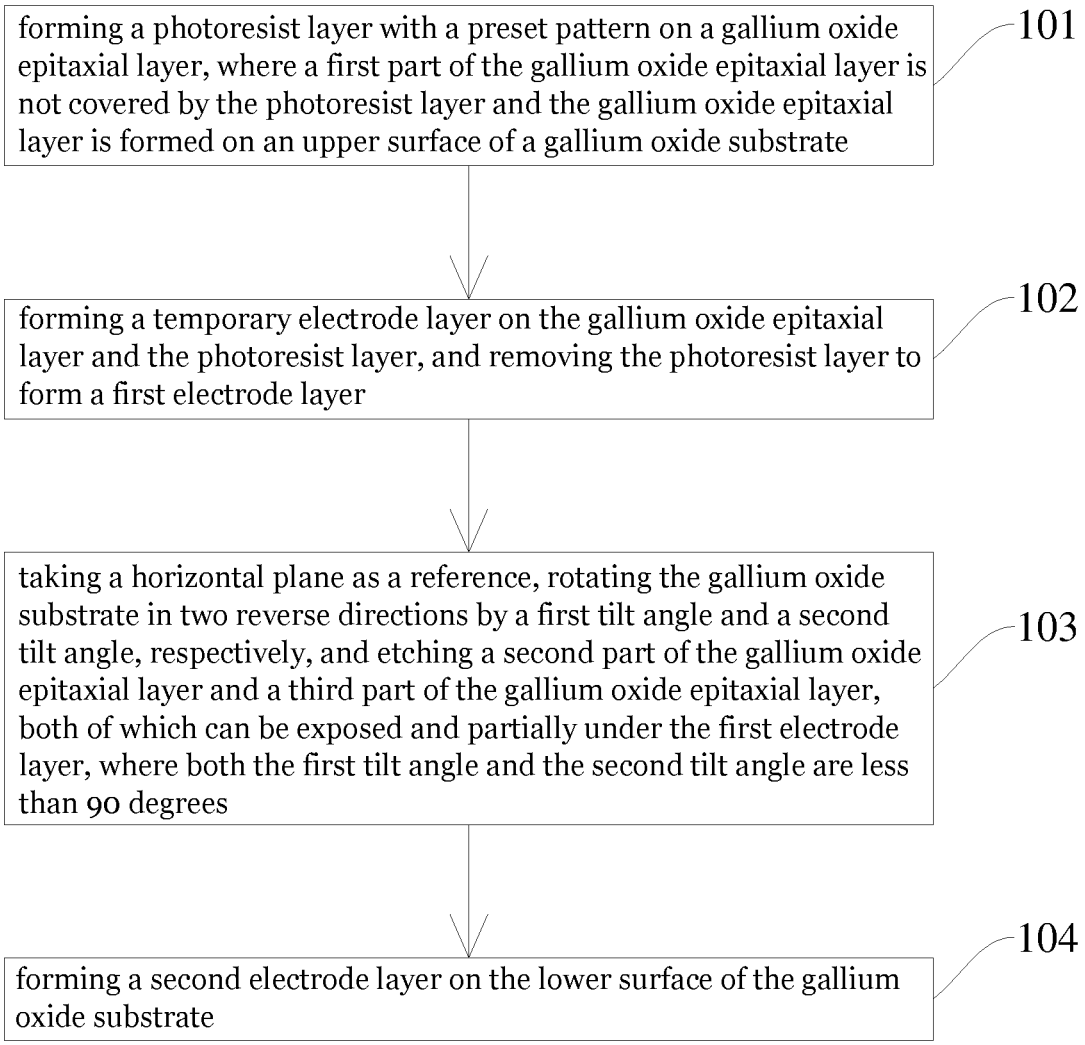
FIG. 1 is a flow diagram of the method for producing gallium oxide Schottky barrier diode with negative beveled angle terminal according to embodiments of the present application.

In the following description, for illustrative rather than limiting, specific details such as specific system structure, technology and the like are provided in order to thoroughly understand embodiments of the present application. However, those ordinarily skilled in the art should understand that aspects of the present application may also be implemented in other embodiments without one or more these specific details. It is noted that in some cases, detailed description of well-known systems, devices, circuits, and methods may be omitted, so as not to interfere with the description of the present application with unnecessary details.

It should be understood that when used in the present application, the term "including" indicates the presence of the described features, ensembles, steps, operations, elements and/or components, but does not exclude the presence or addition of one or more other features, ensembles, steps, operations, elements, components and/or collections thereof.

It should also be understood that the term "and/or" as used in the present application refers to any combination of one or more of the associated listed items and all possible combinations, and include these combinations.

As used in the present application, the term "if" may be interpreted in the context to mean "when . . . ", "once", "upon", "in response to". Similarly, the term "if determined" or "if something is detected" may be interpreted as meaning "once determined", "in response to determination", "once something is detected" or "in response to detection of something".

In addition, in the present application, the terms "first", "second", "third", etc. are only used to distinguish, and cannot be understood as indicating or implying relative importance.

Beveled angle terminal is one of the important terminal structures to improve the performance of power diodes, where the surface of negative beveled angle terminal has stronger electric field control ability than positive beveled angle terminal, and negative beveled angle terminal saves more area. However, it is hard for the etching methods in the prior art to realize the processing of the negative beveled angle terminal. Therefore, there is an urgent need to develop new processing technologies.

To solve the above technical problem, the present application provides a method for producing gallium oxide Schottky barrier diode with negative beveled angle terminal. The method can realize the production of gallium oxide Schottky barrier diode with negative beveled angle terminal by the following steps: forming a photoresist layer with a preset pattern on a gallium oxide epitaxial layer, where a first part of the gallium oxide epitaxial layer is not covered by the photoresist layer and the gallium oxide epitaxial layer is formed on an upper surface of a gallium oxide substrate; forming a temporary electrode layer on the gallium oxide epitaxial layer and the photoresist layer, and removing the photoresist layer to form a first electrode layer; taking a horizontal plane as a reference, rotating the gallium oxide substrate in two reverse directions by a first tilt angle and a second tilt angle, respectively, and etching a second part of the gallium oxide epitaxial layer and a third part of the gallium oxide epitaxial layer, both of which can be exposed and partially under the first electrode layer, where both the first tilt angle and the second tilt angle are less than 90 degrees; and forming a second electrode layer on the lower surface of the gallium oxide substrate.

The following in combination with the accompanying drawings and embodiments, the method provided by the present application is described in detail. As shown in FIG. 1, the method includes four steps that are step 101 to step 104 and they are described, respectively, in detail in the following.

Figure 2A:
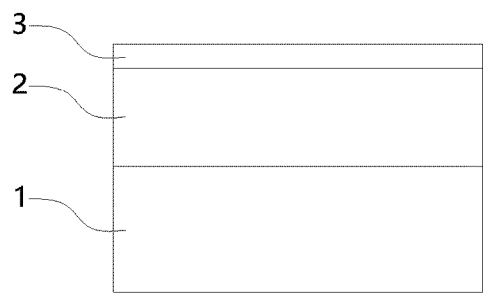
FIG. 2A and FIG. 2B are two schematic diagrams of forming the photoresist layer with the preset pattern in the production method according to embodiments of the present application.
Figure 2B:
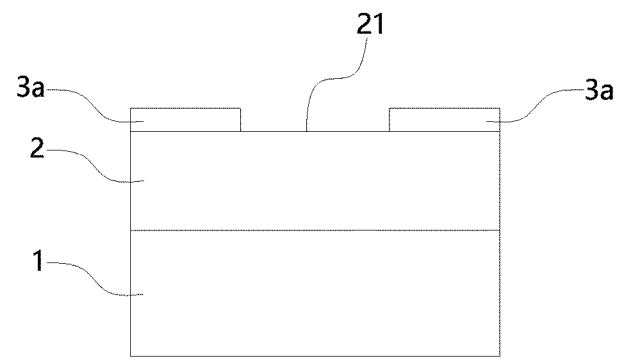

Step 101: as shown in FIG. 2B, forming a photoresist layer 3a with a preset pattern on a gallium oxide epitaxial layer 2, where a first part 21 of the gallium oxide epitaxial layer 2 is not covered by the photoresist layer 3a and the gallium oxide epitaxial layer 2 is formed on an upper surface of a gallium oxide substrate 1.

In a possible embodiment, forming a photoresist layer 3a with a preset pattern on a gallium oxide epitaxial layer 2 includes:
as shown in FIG. 2A, forming a temporary photoresist layer 3 on the gallium oxide epitaxial layer 2; and
as shown in FIG. 2B, photoetching the temporary photoresist layer 3 to form the preset pattern and expose the first part 21 of the gallium oxide epitaxial layer 2, and the photoresist layer 3a with the preset pattern is formed.

In this embodiment, before forming the temporary photoresist layer 3 on the gallium oxide epitaxial layer 2, the gallium oxide epitaxial layer 2 may be cleaned.

Exemplary, the gallium oxide epitaxial layer 2 may be cleaned sequentially with acetone, isopropanol, and deionized water.

In this embodiment, photoetching the temporary photoresist layer 3 includes photolithography, exposure, development of the temporary photoresist layer 3, thus exposing the first part 21 of the gallium oxide epitaxial layer 2.

Step 102: forming a temporary electrode layer on the gallium oxide epitaxial layer and the photoresist layer, and removing the photoresist layer to form a first electrode layer.

Figure 3A:
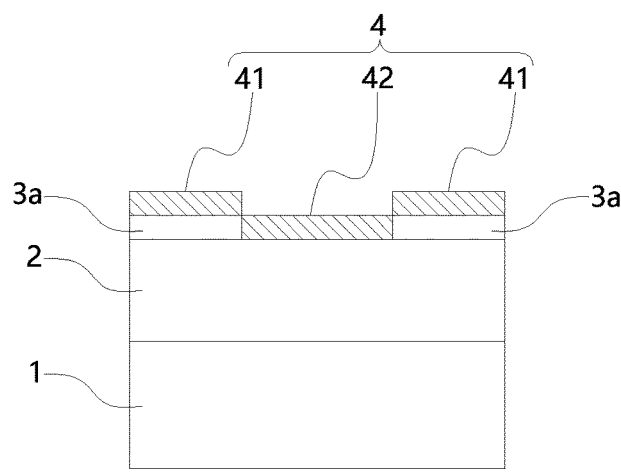
FIG. 3A and FIG. 3B are two schematic diagrams of forming the first electrode layer in the production method according to embodiments of the present application.
Figure 3B:
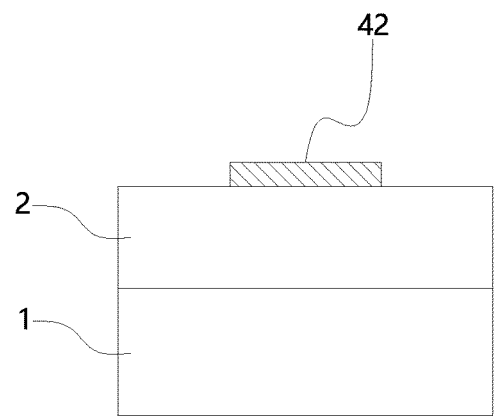

In a possible embodiment, step 102 specifically includes the following steps:
as shown in FIG. 3A, forming a first part 41 of the temporary electrode layer 4 on the photoresist layer 3a and a second part 42 of the temporary electrode layer 4 on the first part of the gallium oxide epitaxial layer 2; and
as shown in FIG. 3B, removing the photoresist layer 3a and the first part 41 of the temporary electrode layer 4, where the second part 42 of the temporary electrode layer 4 is retained as a first electrode layer.

In this embodiment, the temporary electrode layer 4 may be formed by electron beam evaporation or sputtering metal and the second electrode layer may be formed by electron beam evaporation.

Exemplary, when sputtering anode metal in a self-aligning manner to form the temporary electrode layer 4, the target purity may be 99.99% and the sputtering power may be 150 watts.

Exemplary, after the electron beam evaporates anode metal to form the temporary electrode layer 4, excess metal may be stripped and then may perform cleaning.

In this embodiment, the thickness of the first electrode layer 42 and the thickness of the photoresist layer 3a may be equal or unequal.

Exemplary, the material of the first electrode layer 42 may be Ni or Au. When the material of the first electrode layer 42 is Ni, the thickness of the first electrode layer 42 may be 50 nanometers (nm); when the material of the first electrode layer 42 is Au, the thickness of the first electrode layer 42 may be 400 nm.

Figure 4A:
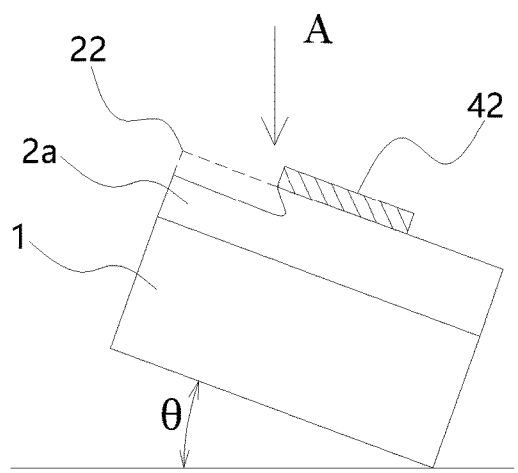
FIG. 4A and FIG. 4B are two schematic diagrams of rotating the gallium oxide substrate and etching the gallium oxide epitaxial layer in the production method according to embodiments of the present application.
Figure 4B:
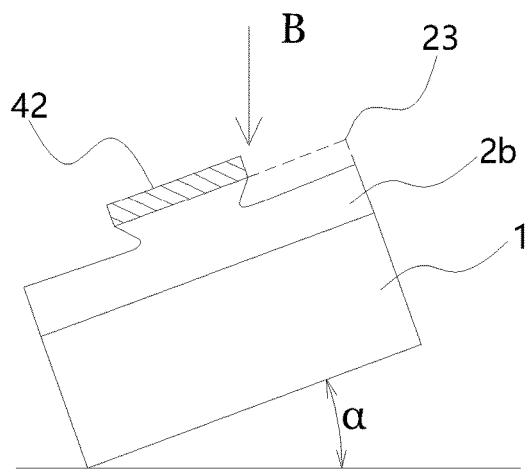

Step 103: as shown in FIG. 4A and FIG. 4B, taking a horizontal plane as a reference, rotating the gallium oxide substrate 1 in two reverse directions by a first tilt angle $\theta$ and a second tilt angle $\alpha$, respectively, and etching a second part 22 of the gallium oxide epitaxial layer 2 and a third part 23 of the gallium oxide epitaxial layer 2, both of which can be exposed and partially under the first electrode layer 42, where both the first tilt angle $\theta$ and the second tilt angle $\alpha$ are less than 90 degrees.

In a possible embodiment, both the first tilt angle $\theta$ and the second tilt angle $\alpha$ may be more than 30 degrees and less than 60 degrees.

In a possible embodiment, the first tilt angle $\theta$ may be equal to the second tilt angle $\alpha$.

In a possible embodiment, both etching the second part 22 of the gallium oxide epitaxial layer 2 and etching the third part 23 of the gallium oxide epitaxial layer 2 are performed in a plurality of times to ensure that the etched shapes meet the preset accuracy requirements.

In a possible embodiment, after etching the second part 22 and the third part 23 of the gallium oxide epitaxial layer 2, the etched gallium oxide epitaxial layer may be cleaned.

Exemplary, the etched gallium oxide epitaxial layer may be cleaned with acetone, isopropanol, and deionized water.

Exemplary, all the etching in step 103 may be achieved using the method of inductively coupled plasma (ICP) etching. When etch the gallium oxide epitaxial layer 2, the first etch step, as shown in FIG. 4A, may rotate the gallium oxide substrate 1 by a first tilt angle θ and etch the second part 22 using the ICP etching method along the etching direction A. When the first etch step is finished, an etched gallium oxide epitaxial layer 2a is formed. The second etch step may etch the etched gallium oxide epitaxial layer 2a, as shown in FIG. 4B. In the second etch step, the gallium oxide substrate 1 may be rotated by a second tilt angle α and the etched gallium oxide epitaxial layer 2a may be etched using the ICP etching method along the etching direction B. When the second etch step is finished, a further etched gallium oxide epitaxial layer 2b is formed. The gas used in the ICP etching may be sulfur hexafluoride ($SF_6$), argon gas (Ar), boron trichloride ($BCl_3$) or other gases. The scope of the first tilt angle θ is: 90°>θ>0°, and a preferred scope is: 60°>θ>30°. The scope of the second tilt angle α is: 90°>θ>0°, and a preferred scope is: 60°>θ>30°. The first tilt angle θ may be equal to the second tilt angle α or not, where the first tilt angle θ being equal to the second tilt angle α is preferred.

Figure 5:
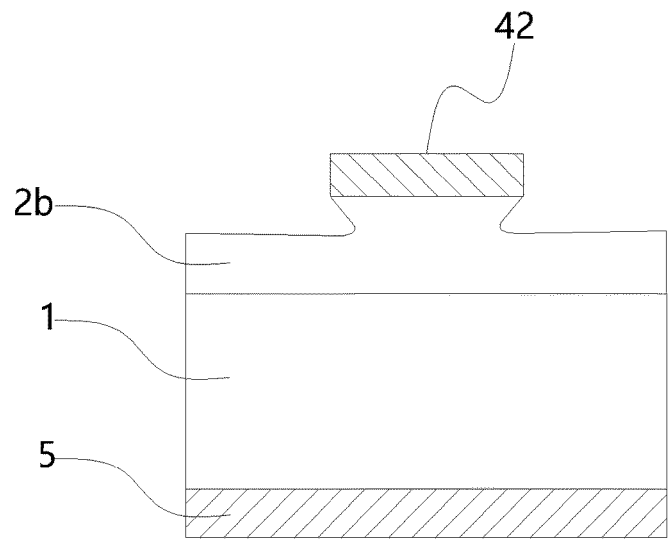
FIG. 5 is a schematic diagram of forming the second electrode layer in the production method according to embodiments of the present application.
Figure 6:
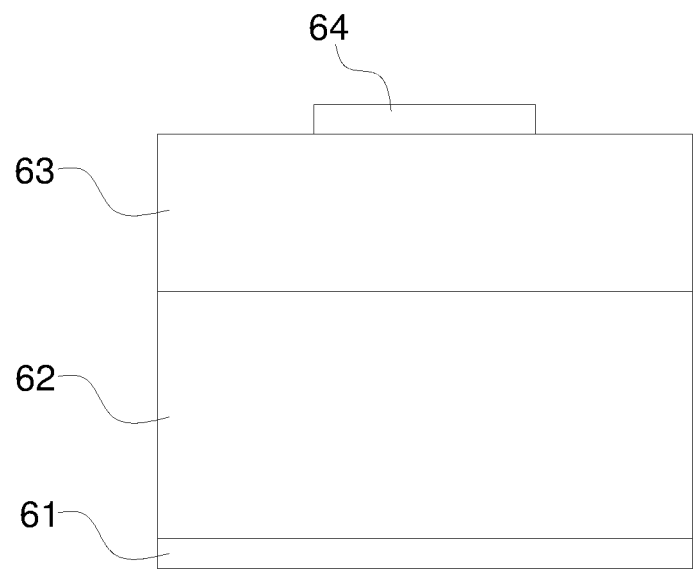
FIG. 6 is a schematic diagram of the structure of the Schottky barrier diode in the prior art.
Figure 7:
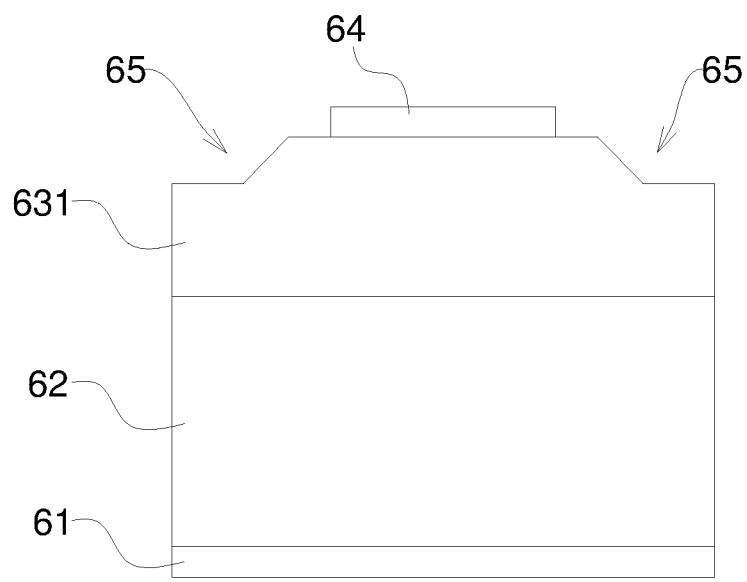
FIG. 7 is a schematic diagram of the structure of the Schottky barrier diode with positive beveled angle terminal in the prior art.
Figure 8:
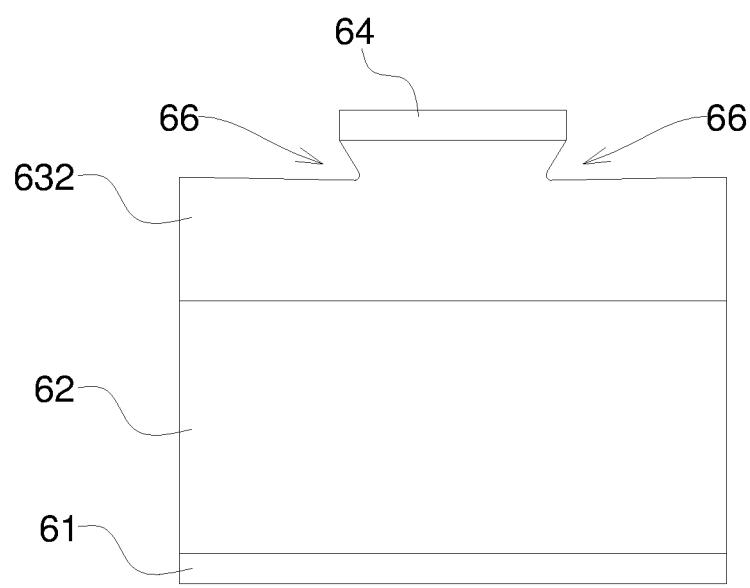
FIG. 8 is a schematic diagram of the structure of the Schottky barrier diode with negative beveled angle terminal in the prior art.

Step 104: as shown in FIG. 5, forming a second electrode layer 5 on the lower surface of the gallium oxide substrate 1.

In a possible embodiment, the second electrode layer 5 is formed by electron beam evaporation.

Exemplary, the material of the second electrode layer 5 may be Ti or Au. When the material of the second electrode layer 5 is Ti, the thickness of the second electrode layer 5 may be 20 nm; when the material of the second electrode layer 5 is Au, the thickness of the second electrode layer 5 may be 400 nm.

The present application provides a production method of gallium oxide diode device with negative beveled angle terminal. When the production method provided is implemented, by rotating the gallium oxide substrate in two reverse directions, respectively, at a certain angle, it can partially expose the gallium oxide epitaxial layer under the first electrode layer to the etching range, thus realizing the processing of the negative beveled angle terminal and solving the technical problem that the negative beveled angle terminal is hard to be processed by the etching method in the prior art. Every above non-vertical rotation corresponds to at least one etches. The next etch continuously complements the previous etch, and finally forms the negative beveled angle terminal. In addition, self-alignment technique may be used in the production process of the Schottky barrier diode, such as anode self-aligning filling. The gallium oxide diode device with the negative beveled angle terminal has good withstand voltage characteristic.

The present application further provides a gallium oxide Schottky barrier diode device with negative beveled angle terminal. As shown in FIG. 5, the gallium oxide diode device includes a gallium oxide substrate 1, a gallium oxide epitaxial layer 2b, a first electrode layer 42 and a second electrode layer 5. The gallium oxide epitaxial layer 2b is formed on an upper surface of the gallium oxide substrate 1. An upper part of the gallium oxide epitaxial layer 2b is a boss structure which extends from the gallium oxide epitaxial layer 2b to the gallium oxide substrate 1 with a width of the boss structure decreasing gradually. The first electrode layer 42 is formed on the gallium oxide epitaxial layer 2b. The second electrode layer 5 is formed on a lower surface of the gallium oxide substrate 1.

The side surfaces of the boss structure slope towards the area under the first electrode layer 42. The side surfaces of the boss structure are formed by rotating the gallium oxide substrate 1 in different directions by some angles, respectively, and etching some parts of the gallium oxide epitaxial layer, where all the parts of the gallium oxide epitaxial layer are exposed and partially under the first electrode layer 42. The angles may be 30 degrees to 60 degrees.

Exemplary, the gallium oxide Schottky barrier diode device with negative beveled angle terminal may be manufactured by the production method provided in the present application.

It should be understood that the size of the sequence numbers of the steps in the above embodiments does not mean the sequence of execution, and the execution sequence of each process should be determined by its function and internal logic, and should not constitute any limitation to the implementation process of the embodiments of the present application.

The above descriptions are only some embodiments of the present disclosure, and are not intended to limit the present disclosure. Any modifications, equivalent replacements and improvements made within the spirit and principle of the present disclosure shall be included within the protection scope of the present disclosure.

The invention claimed is:

1. A method comprising:
    forming a photoresist layer with a preset pattern on a gallium oxide epitaxial layer, wherein a first part of the gallium oxide epitaxial layer is not covered by the photoresist layer, and the gallium oxide epitaxial layer is formed on an upper surface of a gallium oxide substrate;
    forming a temporary electrode layer, wherein a first part of the temporary electrode layer is on the photoresist layer and a second part of the temporary electrode layer is on the first part of the gallium oxide epitaxial layer;
    removing the photoresist layer and the first part of the temporary electrode layer, wherein the second part of the temporary electrode layer is retained as a first electrode layer;
    rotating, in a first direction, the gallium oxide substrate such that the gallium oxide substrate and a horizontal plane form a first tilt angle, to expose a second part of the gallium oxide epitaxial layer that is partially under the first electrode layer, and etching the second part of the gallium oxide epitaxial layer, wherein the first tilt angle is less than 90 degrees and an etched gallium oxide epitaxial layer is formed;
    rotating, in a second direction, the gallium oxide substrate such that the gallium oxide substrate and the horizontal plane form a second tilt angle, to expose a first part of the etched gallium oxide epitaxial layer that is partially under the first electrode layer, and etching the first part of the etched gallium oxide epitaxial layer, wherein the second tilt angle is less than 90 degrees; and
    forming a second electrode layer on the lower surface of the gallium oxide substrate.

2. The method according to claim 1, wherein forming the photoresist layer with the preset pattern comprises:
    forming a temporary photoresist layer on the gallium oxide epitaxial layer; and photoetching the temporary photoresist layer to form the preset pattern and expose the first part of the gallium oxide epitaxial layer, whereby forming the photoresist layer with the preset pattern.

3. The method according to claim 1, wherein both the first tilt angle and the second tilt angle are more than 30 degrees and less than 60 degrees.

4. The method according to claim 1, wherein the first tilt angle is equal to the second tilt angle.

5. The method according to claim 1, wherein both etching the second part of the gallium oxide epitaxial layer and etching the first part of the etched gallium oxide epitaxial layer are performed a plurality of times.

6. The method according to claim 1, wherein the temporary electrode layer is formed by electron beam evaporation or sputtering metal, and the second electrode layer is formed by electron beam evaporation.

7. The method according to claim 1, wherein the gallium oxide substrate is a high doped N type gallium oxide substrate, and the gallium oxide epitaxial layer is a low doped N type gallium oxide epitaxial layer.

* * * * *